United States Patent [19]

Rahman et al.

[11] Patent Number: 5,476,750

[45] Date of Patent: Dec. 19, 1995

[54] METAL ION REDUCTION IN THE RAW MATERIALS AND USING A LEWIS BASE TO CONTROL MOLECULAR WEIGHT OF NOVOLAK RESIN TO BE USED IN POSITIVE PHOTORESISTS

[75] Inventors: M. Dalil Rahman, Warwick, R.I.; Ping-Hung Lu, Bridgewater, N.J.; Daniel P. Aubin, Rockville, R.I.; Ralph R. Dammel, Coventry, R.I.; Dana L. Durham, East Greenwich, R.I.

[73] Assignee: Hoechst Celanese Corporation, Somerville, N.J.

[21] Appl. No.: 999,500

[22] Filed: Dec. 29, 1992

[51] Int. Cl.$^6$ .................. G03F 7/00; G03C 1/72; C08G 8/04; C02F 1/42
[52] U.S. Cl. .............. 430/270; 430/168; 430/169; 430/192; 430/193; 528/482; 528/486; 528/145; 528/146; 210/660; 210/681; 210/688
[58] Field of Search .................. 430/169, 270, 430/192, 168, 905; 210/660, 681, 688, 683, 685; 528/482, 486, 145, 146

[56] References Cited

U.S. PATENT DOCUMENTS

| | | | |
|---|---|---|---|
| 2,929,808 | 4/1956 | Ross et al. | 528/482 |
| 4,033,909 | 7/1977 | Papa | 528/482 |
| 4,033,910 | 7/1977 | Papa | 260/94.9 |
| 4,177,343 | 12/1979 | Pannell | 528/482 |
| 4,636,540 | 1/1987 | Warfel | 528/482 |
| 4,747,954 | 5/1988 | Vaughan et al. | 210/681 |
| 4,784,937 | 11/1988 | Tanaka et al. | 260/2.5 F |
| 4,833,067 | 5/1989 | Tanaka et al. | 210/670 |
| 4,870,154 | 9/1989 | Saeki et al. | 528/145 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,286,606 | 12/1994 | Rahman et al. | 430/311 |

FOREIGN PATENT DOCUMENTS

| | | |
|---|---|---|
| 0544324 | 6/1993 | European Pat. Off. . |
| 0544325 | 6/1993 | European Pat. Off. . |
| 1072155 | 3/1989 | Japan . |
| 1509354 | 5/1978 | United Kingdom . |
| 93/12152 | 6/1993 | WIPO . |
| 93/18437 | 9/1993 | WIPO . |
| 94/01807 | 1/1994 | WIPO . |
| WO94/12912 | 6/1994 | WIPO . |
| WO94/14858 | 7/1994 | WIPO . |

OTHER PUBLICATIONS

Derwent Publ. Ltd., London, GB; & JP-A-4065415 (Hitachi Chemical) Feb. 3, 1992.

Derwent Publ. Ltd., London, GB; & JP-A-1228560 (Hitachi) Dec. 9, 1989.

Chemical Abstracts, vol. 112, No. 18, Apr. 30, 1990, Columbus, Ohio, p. 17, Abstract No. 159201u, JP-A-1190713 (Inatomi, Shigeki et al) Jul. 31, 1989.

Bayard; "Water Free of Heavy Metals for Medical Use and Ion Exchange Resin Used in Its Preparation"; Nov. 16, 1992, CA98(26)221589z.

Hirai et al; "Treatment of Waste Waters Containing Formaldehyde and Metals with Chelating Ion Exchange Resin"; Nov. 5, 1975; CA84(14):95328j.

Kimura et al; "Purification of Formaldehyde"; Mar. 9, 1977; CA87(7):52776y.

Journal of the Electrochemical Society, vol. 137, No. 12, Dec. 1990, Manchester, N.H., pp. 393900–393905, XP0001681, T. Tanaka "A New Photolithography Technique with Antireflective Coating on Resist or ARCOR.".

Amberlite Ion Exchange Resins Laboratory Guide, Rohm and Haas Company, Philadelphia, Pa., USA, Sep. 1979.

Primary Examiner—Charles L. Bowers, Jr.
Assistant Examiner—John S. Chu
Attorney, Agent, or Firm—Andrew F. Sayko, Jr.

[57] ABSTRACT

The present invention provides methods for producing water insoluble, aqueous alkali soluble novolak resins having a very low level of metal ions and a substantially consistent molecular weight. A method is also provided for producing photoresist composition from such novolak resins and for producing semiconductor devices using such photoresist compositions.

7 Claims, No Drawings

METAL ION REDUCTION IN THE RAW MATERIALS AND USING A LEWIS BASE TO CONTROL MOLECULAR WEIGHT OF NOVOLAK RESIN TO BE USED IN POSITIVE PHOTORESISTS

BACKGROUND OF THE INVENTION

The present invention relates to a process for reducing metals ion in raw materials such as cresols, formaldehyde, and oxalic acid and for producing novolak resin of consistent molecular weight having a very low level of metal ions, especially sodium and iron, and for using such novolak resin in light-sensitive compositions. The present invention also relates to a process for making light-sensitive compositions used in positive-working photoresist compositions. Further, the present invention relates to a process for coating substrates with these light-sensitive compositions as well as the process of coating, imaging and developing these light-sensitive mixtures on substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCL gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels of less than 1.0 ppm in the photoresist have been found to adversely affect the properties of such semiconductor devices.

Novolak resins are frequently used a polymeric binder in liquid photoresist formulations. These resins are typically produced by conducting a condensation reaction between formaldehyde and one or more multi-substituted phenols, in the presence of an acid catalyst, such as oxalic acid. In producing sophisticated semiconductor devices, it has become increasingly important to provide novolak resin having a substantially consistent molecular weight and a metal contamination level well below 1.0 ppm. During raw materials purification to remove metals a minor amount of Lewis base is also removed. It was surprisingly discovered that when the level of Lewis base is too low the production of novolak resin failed because of the depolymerisation of resin at a high temperature distillation step of the process.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing novolak resins having a substantially consistent molecular weight and containing a very low levels of metal ions, especially sodium and iron. The invention also relates to a photoresist containing such novolak resins. The invention further relates to the control of the amount of Lewis base in a process of producing such novolak resins having a substantially consistent molecular weight. The invention further relates to a process for producing semiconductor devices using such photoresists containing these novolak resin and a photosensitizer.

The process of the subject invention provides a water insoluble, aqueous alkali soluble novolak resin obtained by condensing with formaldehyde one or more phenolic compounds, such as recta-cresol, para-cresol, 3,5-dimethylphenol or 2,4-dimethylphenol.

The novolak resins obtained have very low levels of metal ions such as iron, sodium, potassium, calcium, magnesium, copper and zinc. The total metal ion level is preferably less than 1 ppm, more preferably less than 500 ppb. Sodium and iron are the most common metal ion contaminants and among the easiest to detect. The level of these metal ions serves as an indicator of the level of other metal ions. The level of sodium and iron ions, are respectively, less than 100 ppb and 400 ppb, preferably less than 75 ppb and 300 ppb, more preferably less than 50 ppb and 200 ppb, even more preferably less than 30 ppb and 130 ppb and most preferably less than 10 ppb and 10 ppb.

Water insoluble, aqueous alkali soluble novolak resin having a very low levels of metal ions may be obtained by condensing formaldehyde having a very low level of metal ions with one or more phenolic compounds,such as m-cresol, p-cresol, 2,4 and 2,5 -dimethylphenol having a very low level of metal ions. The condensation reaction is preferably carried out in the presence of a catalyst, such as oxalic acid. In a preferred embodiment of the process of the present invention, the oxalic acid also has a very low level of metal ions.

In the process of the present invention it is necessary to adjust the amount of Lewis base present before or after the condensation, to stabilize the molecular weight.

DETAILED DESCRIPTION OF THE PREFERRED EMBODIMENT

The present invention provides a process for producing novolak resin having a substantially consistent molecular weight and containing a very low level of metal ions, particularly sodium and iron. The subject process utilizes an acidic ion exchange resin to purify the formaldehyde and, in a preferred embodiment, uses the same type of ion exchange resin to purify the catalyst, e.g. oxalic acid. In a preferred embodiment, the process uses the same type of ion exchange resin to purify the cresol raw materials, e.g. methylphenol, dimethylphenol, or mixtures of them. The subject process comprises:

a) treating an acidic ion exchange resin with water, preferably deionized water, followed by a mineral acid solution (e.g. a 5–98% solution of sulfuric, nitric or hydrochloric acid) to reduce the level of sodium and iron ions in the ion exchange resin to less than 500 ppb each, preferably less than 100 ppb, more preferably less than 50 ppb and most preferably no more than 20 ppb;

b) passing a water/formaldehyde solution through the ion exchange resin and reducing the level of sodium and iron ions in the solution to less than 500 ppb each, preferably less than 375 ppb, more preferably less than 250 ppb, even more preferably less than 100 ppb and most preferably less than 40 ppb;

c) producing one or more phenolic compounds having a level of sodium and iron ion content of less than 400 ppb each, preferably less than 200 ppb, more preferably less than 50 ppb and most preferably less than 30 ppb;

d) condensing the formaldehyde with one or more of the phenolic compounds, preferably in the presence of a catalyst, preferably an acid catalyst, more preferably oxalic acid, adjusting the Lewis base concentration before and/or after the condensation to at level of from about 10 to about 1000 ppm, preferably 20 to 500 ppm, most preferably 30 to 300 ppm, to produce a water insoluble, aqueous alkali soluble novolak resin having a desired and substantially consistent molecular weight and a sodium and iron ion level of less than 500 ppb each, preferably less than 375 ppb, more preferably less than 250 ppb, even more preferably less than 100 ppb and most preferably less than 40 ppb.

The present invention further provides a process for producing a positive photoresist composition having a very low level of total sodium and iron ions. The subject process comprises:

a) treating an acidic ion exchange resin with water, preferably deionized water, followed by a mineral acid solution (e.g. sulfuric, nitric or hydrochloric acid) to reduce the level of sodium and iron ions in the ion exchange resin to less than 500 ppb each, preferably less than 100 ppb, more preferably less than 50 ppb and most preferably no more than 20 ppb;

b) passing a water/formaldehyde solution through the ion exchange resin and reducing the sodium and iron ion level to less than 500 ppb each, preferably less than 375 ppb, more preferably less than 250 ppb, even more preferably less than 100 ppb and most preferably less than 40 ppb;

c) producing one or more phenolic compounds having the level of a sodium and iron ion content of less than 400 ppb each, preferably less than 200 ppb, more preferably less than 50 ppb and most preferably less than 30 ppb;

d) condensing the formaldehyde with one or more of the phenolic compounds, in the presence of a catalyst, preferably an acid catalyst, more preferably oxalic acid, adjusting the Lewis base concentration before and/or after the condensation to a level of from about 10 to about 1000 ppm, preferably 20 to 500 ppm, most preferably 30 to 300 ppm, to produce a water insoluble, aqueous alkali soluble novolak resin having a desired and substantially consistent molecular weight and a sodium and iron ion level of less than 500 ppb each, preferably less than 375 ppb, more preferably less than 250 ppb, even more preferably less than 100 ppb and most preferably less than 40 ppb;

e) providing an admixture of: 1) a photosensitive component in an amount sufficient to photosensitize the photoresist composition; 2) the water insoluble, aqueous alkali soluble novolak resin having a low level of total sodium and iron ions, and a dersired and substantially consistent molecular weight, and 3) a suitable solvent.

The invention further provides a method for producing a semiconductor device by producing a photo-image on a substrate by coating a suitable substrate with a positive working photoresist composition by:

a) treating an acidic ion exchange resin with water, preferably deionized water, followed by a mineral acid solution (e.g. sulfuric, nitric or hydrochloric acid) to reduce the sodium and iron ions in the ion exchange resin to less than 500 ppb each, preferably less than 100 ppb, more preferably less than 50 ppb and most preferably no more than 20 ppb;

b) passing a water/formaldehyde solution through the ion exchange resin and reducing the sodium and iron ion level to less than 500 ppb each, preferably less than 375 ppb, more preferably less than 250 ppb, even more preferably less than 100 ppb and most preferably less than 40 ppb;

c) producing one or more phenolic compounds and reducing the level of a sodium and iron ions to less than 400 ppb each, preferably less than 200 ppb, more preferably less than 50 ppb and most preferably less than 30 ppb;

d) condensing the formaldehyde with one or more of the phenolic compounds in the presence of a catalyst, preferably an acid catalyst, more preferably oxalic acid, adjusting the Lewis base concentration before and/or after the condensation to a level of from about 10 to about 1000 ppm, preferably from about 20 to 500 ppm, most preferably from about 30 to 300 ppm, to produce a water insoluble, aqueous alkali soluble novolak resin having a desired and substantially consistent molecular weight and a sodium and iron ion level of less than 500 ppb each, preferably less than 375 ppb, more preferably less than 250 ppb, even more preferably less than 100 ppb and most preferably less than 40 ppb;

e) providing an admixture of: 1) a photosensitive component in an amount sufficient to photosensitize the photoresist composition; 2) the water insoluble, aqueous alkali soluble novolak resin having a desired and substantially consistent molecular weight and a low level of total sodium and iron ions and 3) a suitable solvent;

f) heat treating the coated substrate until substantially all of the solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

It has been surprisingly found that a novolak resin containing very low levels of metal ion contamination as well as desired molecular weight cannot be obtained by condensing formaldehyde with one or more phenolic compounds, in the presence of catalyst, unless one either: 1) adjusts the concentration of Lewis base before condensation, 2) adjusts the concentration of Lewis base after the condensation or 3) adjusts the concentration of Lewis base both before and after condensation or 4) adjusts the concentration of Lewis base in the raw materials, such as cresols, by adding or removing a Lewis base.

An acidic ion exchange resin, such as a styrene/divinylbenzene cation exchange resin is utilized in the present process. Such ion exchange resins are available from Rohm and Haas Company, e.g. AMBERLYST 15 resin. These resins typically contain as much as 80,000 to 200,000 ppb of sodium and iron. Before being utilized in the process of the invention, the ion exchange resin must be treated with water and then a mineral acid solution to reduce the metal ion level. Preferably the ion exchange resin is initially rinsed with deionized water, followed by a mineral acid solution such as a 10 percent sulfuric acid solution, rinsed again with deionized water, treated again with the mineral acid solution and once more rinsed with deionized water.

The formaldehyde is preferably passed through a column containing the ion exchange resin as a solution, e.g. a solution of about 38 percent formaldehyde in water and methanol Such solutions typically contain from 250 to 1000 ppb each of sodium and iron ions. During the process of the present invention, these levels are each reduced to as low as 10 ppb.

The phenolic compounds condensed with the purified formaldehyde must also have a low level of metal ions. Such low levels may be achieved by distilling such phenolic compounds so that the total sodium and iron ion content is as low as 50 ppb or less. Such low levels may also be obtained by passing through the contamination free ion exchange resin column so that the total sodium and iron ion content is as low as 30 ppb or less. Another method to obtain such low levels is by solvent extraction. Phenolic compounds can be extracted with 10% acid solution in water to remove metals to a level as low as 30 ppb or less each.

It was surprisingly discovered that during the purification process of phenolic compounds by ion exchange, distillation, and/or solvent extraction process to remove metal ions, a minor mount of Lewis base was also removed. Due to the absence or too low a concentration of the Lewis base, the novolak resin was partially depolymerized during the manufacturing process. The physical properties of the depolymerized resin change due to degradation and it is in an undesirable way for photoresist compositions. This problem can be substantially avoided by adjusting the amount of Lewis base before and/or after the condensation step of novolak manufacturing process. The Lewis bases can be present in the range of from about 10–1000 ppm, preferably from about 20 to 500 ppm, most preferably from about 30 to 300 ppm. Lewis bases that may be used include hydroxides of organic countefions such as tetra-substituted ammonium hydroxide (Formula 1), or other organic bases (Formulas 2 to 4), added to the reaction mixture either neat as a solid or liquid or used either as a salt or a solution either in water or a suitable organic solvent, or a mixture of an organic solvent and water.

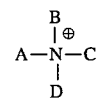

Formula 1 where the substituents A, B, C and D may be $C_1$–$C_{10}$ alkyl or alkenyl (both straight-chain and branched), particularly preferred are $C_1$–$C_2$ alkyl, the alkyl chains may optionally be heteroatom substituted, with one or more of N or O; $C_3$–$C_{10}$ cycloalkyl, preferably 5–6, with optional heteroatom substitution, with one or more of N or O; $C_6$–$C_{12}$ aryl or alkylaryl ($C_1$–$C_{10}$ alkyl, $C_6$–$C_{12}$ aryl) substituents; $C_1$–$C_{10}$ alkyloxy or $C_3$–$C_{10}$ cycloalkyloxy, $C_6$–$C_{12}$ aryloxy; $C_1$–$C_{10}$ alkyl or $C_6$–$C_{12}$ aryl carboxylic acid or ester —COOR and keto-substitutents —C(=O)R, where R is H, $C_1$–$C_{10}$ alkyl or $C_6$–$C_{12}$ aryl, in particular methyl as alkyl, and including heteroatom-substituted $C_6$–$C_{12}$ aryl residues, substituted with one or more of N or O, in particular aza and oxa-substitution; amino, $C_1$–$C_{10}$ alkyl- and dialkylamino, preferably $C_1$ to $C_5$ alkyl, most preferably $C_1$ to $C_2$; $C_3$–$C_{10}$ cycloalkylamino and dicycloalkylamino, preferably $C_5$–$C_6$ cycloalkyl; $C_3$–$C_{10}$ cycloalkyl where two or more of the substituents A to D are part of a cyclic or polycylic ring system which optionally may be heteroatom substituted with one or more of N or O. Most preferred is tetramethylammonium hydroxide as an aqueous solution.

Other preferred Lewis bases are shown in formulas 2 to 4:

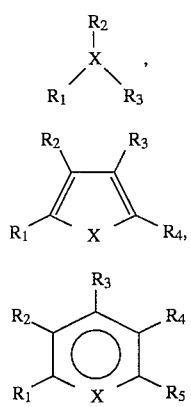

Formula 2

Formula 3

Formula 4 where $X=N$ or $CR_6$, provided that there is at least one basic center in the molecule if $X=CR_6$ and where in formula 2 X can be P; where $R_1$ to $R_6$ may be any of the following: hydrogen, $C_1$–$C_{10}$ alkyl (both straight-chain and branched), preferably $C_1$–$C_5$ alkyl, most preferred $C_1$–$C_2$ alkyl, and where the alkyl chains may optionally be heteroatom substituted with one or more of N or O; $C_3$–$C_{10}$ cycloalkyl, preferably $C_5$–$C_6$, with optional heteroatom substitution with one or more of N or O, where in the case of azacycloalkyl substituents, attachment to the aryl ring is preferably effected via the aza site; hydroxy, $C_1$–$C_{10}$ alkyloxy or $C_3$–$C_{10}$ cycloalkyloxy, $C_6$–$C_{12}$ aryloxy; $C_1$–$C_{10}$ alkyl or $C_6$–$C_{12}$ aryl carboxylic acid or ester —COOR and keto-subsitutent —C(=O)R, where R is H, $C_1$–$C_{10}$ alkyl or $C_1$–$C_{12}$ aryl, in particular methyl as alkyl, and including heteroatom-substituted $C_6$–$C_{12}$ aryl residues substituted with one or more of N or O, in particular aza and oxa-substitution; halogen or nitro; amino, $C_1$–$C_{10}$ alkyl- and dialkylamino, preferably $C_1$ to $C_5$ alkyl, most preferably $C_1$ to $C_2$; $C_3$–$C_{10}$ cycloalkylamino and dicycloalkylamino, preferentially $C_5$–$C_6$ cycloalkyl; $C_3$–$C_{10}$ cycloalkyl where two or more of the substituents $R_1$ to $R_5$ are pan of a cyclic or polycylic ting system which optionally may be heteroatom substituted with one or more of N or O, wherein adjacent R group can pan of a $C_5$–$C_{12}$ cyclic group, preferably $C_5$–$C_7$.

The consistency of the molecular weight is determined by measuring the Void Viscosity ("V.V"), the GPC Molecular Weight of the final novolak resin and the GPC Molecular Weight of the novolak resin before distillation. A novolak resin having a desired and consistent molecular weight produced according to the process of the present invention will have a V.V from more than 10.0 to less than 40.0, preferably from about 12 to about 32.0, more preferably from about 14.0 to about 24.0, most preferably from about 16.0 to about 22.0 and a ratio of final molecular weight ("MW") to molecular weight before distillation ["MW(BD)"] [Ratio=MW/MW(BD)] from about greater than 0.6 to less than about 1.7, preferably from about 0.7 to about 1.5, more preferably from about 0.8 to about 1.3, most preferably from about 0.9 to about 1.1.

Void Viscosity and GPC Molecular Weight are measured using the following procedures:

Void Viscosity Procedure

Make a 26% solution of the resin (6.50 grams of resin in 100 ml jar equipped with magnetic stir bar and cap) add up to 25.00 grams of AZ Thinner Solvent. Filter the solution through a 5 micron membrane syringe filter. Fill viscometers (size #200) in the inverse position to the second line. Place the viscometer in viscosity bath at 25° C. (constant temperature) for 15–20 minutes. Take flow time of resin solution (seconds) and repeat till two constansant readings are obtained. Calculation: Void Viscosity=flow time (in seconds) x constant in centistokes per second at 25° C.

Molecular Weight (MW)

The molecular weight of the polymers, whether weight average molecular weight MW, or number average molecular weight MN, were measured by gel permeation chromatography (GPC) performed on dilute solutions of the polymer in tetrahydrofuran (THF). The actual apparatus employed consisted of a Waters (Millipore Corporation) programmable automatic sampler, vacuum pump, chromatography columns with heater, and a differential refractometer connected to a Shimadzu CR 30A data reduction system with accompanying software (version 1.1, Shimadzu part no. T/N 22301309-91). The refractormeter used was a Waters model 410 and four chromatography columns, 500 Angstrom, 1000 Angstrom, 10,000 Angstrom and 100,000 Angstrom (available from Waters) were connected in series. The system was calibrated using multiple available polystyrene standards ranging in molecular weight as follows:

| GPC CALIBRATION | |
|---|---|
| Calibration Standard (Polystyrene) | Molecular Weight |
| 1 | 470,000 |
| 2 | 170,000 |
| 3 | 68,000 |
| 4 | 34,500 |
| 5 | 9,200 |
| 6 | 3,200 |
| 7 | 1,250 |

The standards are essentially monodisperse, consisting substantially of a single molecular weight. With the system thus claibrated the weight average molecular weight MW, was obtained for polymers produced in accordance with the examples given hereinafter.

In a particularly preferred embodiment of this invention the acid catalyst, e.g. maleic arthydride or oxalic acid, is also passed in solution (e.g. in water) through an acidic ion exchange resin. Untreated oxalic acid typically has metal ion levels of about 1000 to 2000 ppb or higher of each of sodium and iron. After treatment by passing through the ion exchange resin, metal levels are reduced to as low as 10 ppb or less in a 10 percent solution of oxalic acid in deionized water. Even though only about 1 percent of oxalic acid is typically utilized as a catalytic amount in the preferred embodiment of the present process, its contribution of the metal ion concentration could be high.

The present invention relates to a process for producing a novolak resin, a process for producing a photoresist composition containing such a novolak resin and a process for producing semiconductor devices using such a photoresist composition. The photoresist composition is formed by providing an admixture of a photosensitizer, the subject water insoluble, aqueous alkali soluble novolak resin and a suitable solvent. Suitable solvents for such photoresists and for novolak resins may include propylene glycol mono-alkyl ether, propylene glycol alkyl (e.g. methyl) ether acetate, ethyl-3-ethoxypropionate, ethyl tactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA) and ethyl-3-ethoxypropionate (EEP).

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (G.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor, polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other minimized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexaalkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid based etching solution. The photoresist compositions of the present invention are resistant to acid-based etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

30 grams of dry AMBERLYST 15 ion exchange resin beads were placed in a conical flask and deionized (DI) water was added so that all of the resin beads were under water. The flask was sealed and allowed to stand overnight to swell the resin beads. The next morning the water was decanted, deionized water added to cover the resin beads and the flask was shaken slowly. The water was again decanted. The rinsing with deionized water and decanting steps were repeated three more times. The resulting slurry of ion exchange resin was poured into a 22 cm. long glass column having a diameter of 2 cm. and equipped with a porous disk and a stopcock. The resin was allowed to settle to the bottom and the column was back flushed with deionized water for 25 minutes. The resin was again allowed to settle to the bottom.

The bed length was measured and the bed volume was calculated as 72 mi. A 10 percent sulfuric acid solution was passed down through the resin bed at a rate of about 16 ml./min (14.1 bed volumes/hour). 6 bed volumes of the acid solution were passed through the resin bed. 60 bed volumes of deionized water were then passed down through the resin bed at about the same flow rate. The pH of the effluent water was measured to assure that it matched the pH of 6 for fresh deionized water.

500 grams of Ca-28 cresol mixture (cresylic acid) containing about 1000 ppb of sodium and about 500 ppb of iron and 30 ppm of nitrogen base, was passed down through the resin bed at the same flow rate. The cresylic acid obtained had a very low level of metal ions as follows: sodium—<10 ppb, iron—<20 ppb and nitrogen base less than the detectable limit.

EXAMPLE 2

200 grams of cresylic acid (Ca 28) containing 1000 ppm of sodium and 500 ppb of iron and 200 ppm of nitrogen base was distilled under a vacuum of 20 mm pressure. The cresylic acid obtained had a very low level of metal ions and nitrogen bases as follows: Sodium <10 ppb, iron <10 ppb and nitrogen base less than the detection limit.

EXAMPLE 3

100 grams of cresylic acid (Ca 28) containing 10 ppb of sodium and 150 ppb of iron and 100 ppm of nitrogen base was extracted with 10% HCl solution (4× 100 mL). The cresylic acid was washed with DI water (2×100 mL) to remove HCl. The cresylic acid obtained was tested for metals and nitrogen base as follows: Sodium <10 ppb, Iron 80 ppb and nitrogen base less than the detection limit.

EXAMPLE 4

48 lbs. of wet AMBERLYST 15 ion exchange resin beads (38 lbs. dry) were placed in a 1.2 ft.$^3$ resin canister, having a pressure rating of 40 psig. Into a 500 gal. glass-lined feed kettle, having a pressure rating of 100 psig, an agitator and a 3 inch 101 psig rupture disk, was fed 100.0 gal. of DI water. The feed kettle was pressurized to 20 psig using nitrogen and water was slowly transferred through a bottom outlet valve through the resin canister through a feed valve into a glass-lined product kettle, having a pressure rating of 150 psig and a 2 inch 100/100 psig double rupture disk. Both kettles were then drained. With all valves closed, 55 gal. of DI water and then 55 lbs. of 98 percent sulfuric acid were charged to the feed kettle. The agitator was set at 60 rpm and the temperature was maintained at 20°–30° C. The feed kettle was pressurized to 20 psig using nitrogen and the bottom outlet valve was opened to slowly transfer the sulfuric acid solution through the resin canister through the open inlet valve to the product kettle. The inlet valve was opened so as to obtain a liquid flow rate of about 0.35 gal./min. The feed kettle and product kettle were then drained, the feed kettle outlet valve to the resin canister was closed and the feed kettle was rinsed with DI water.

450 gal. of DI water was charged to the feed kettle; the temperature was maintained at 20°–30° C. and the agitator was set at 60 rpm. The feed kettle was pressurized to 20 psig using nitrogen and the bottom outlet valve opened to slowly transfer the water through the resin canister through the inlet valve to the product canister at a liquid flow rate of about 1.8 gal./min. The pH of the water in the product kettle was tested to assure that it matched the pH of fresh DI water. The contents of the feed and product canisters were completely drained after turning off the agitator and all valves were closed.

110 gal. of a 37 percent formaldehyde solution in DI water and 7 percent methanol, having 280 ppb sodium and 280 ppb iron was charged to the feed kettle and the temperature was maintained at 20°–30° C. The bottom outlet valve was opened to slowly transfer the formaldehyde solution through the resin canister. The inlet valve of the product kettle was opened to obtain a liquid flow rate of about 0.7 gal./min. into the product kettle. The formaldehyde obtained had a very low level of metal ions as follows: sodium—<20 ppb, iron—<45 ppb.

EXAMPLE 5

248 lbs. of wet AMBERLYST 15 ion exchange resin beads (196 lbs. dry) were placed in a 6.2 ft.$^3$ resin canister, having a pressure rating of 40 psig. Into the resin canister, cleaned according to the cleaning process set forth in Example 2 was fed 9500 lbs. of formaldehyde as a 37 percent formaldehyde solution in DI water and 7 percent methanol, having about 789 ppb sodium, 547 ppb iron, 118 ppb chromium, and 1487 ppb. calcium. The formaldehyde solution was slowly transferred through the resin canister at a flow rate of about 33.3 lbs. of solution per minute. The formaldehyde obtained had a very low level of metal ions as follows: sodium—12 ppb, iron—4 ppb, chromium—118 ppb, and calcium— 11 ppb.

EXAMPLE 6

The procedure of Example 5 was repeated and 3050 lbs. of formaldehyde as a 37 percent solution in DI water and 7 percent methanol was passed through the resin canister. The formaldehyde obtained had a very low level of metal ions as follows: sodium 12 ppb, iron 4 ppb, chromium 118 ppb, and calcium 11 ppb.

EXAMPLE 7-12

The procedure of Example 5 was repeated and formaldehyde as a 37 percent solution in DI water and 7 percent methanol was passed through the resin canister. The formaldehyde obtained had a very low level of metal ions as shown in the following Table.

TABLE 7

| Metals | Metals in Deionized Formaldehyde (ppb) | | | | | |
|---|---|---|---|---|---|---|
| | Ex 7 | Ex 8 | Ex 9 | Ex 10 | Ex 11 | Ex 12 |
| Na | 9 | 6 | 26 | 6 | 6 | 6 |
| K | <5 | <5 | <5 | <5 | <5 | <5 |
| Fe | <5 | <5 | <5 | <5 | <5 | <5 |
| Cr | <5 | <5 | <5 | <5 | <5 | <5 |
| Cu | <5 | <5 | <5 | <5 | <5 | <5 |
| Pb | <5 | <5 | <5 | 5 | <5 | <5 |
| Mg | 23 | <5 | 10 | <5 | <5 | <5 |
| Zn | 19 | <5 | 87 | 6 | 7 | 6 |
| Ca | 22 | <5 | 36 | <5 | <5 | 15 |
| Mn | <5 | <5 | <5 | <5 | <5 | <5 |
| Ni | <5 | <5 | <5 | <5 | <5 | <5 |

EXAMPLE 8

100 grams of cresols (Ca-28) from example 1 was placed in a four necked flask equipped with a condenser, a thermometer, and a dropping funnel. One gram of oxalic acid (1% of cresols) and 4 grams of DI water and 0.02 gram of 3-picoline (0.02% of cresols) were added and the flask was heated to 95° C. 52.97 g of the formaldehyde (molar ratio of cresol/formaldehyde 1/0.72) from example 5 was added dropwise over three hours. The condensation reaction was allowed to continue for 8 hours at 95° C. and a sample was collected for GPC analysis to determine the molecular weight. The unreacted raw materials were distilled off using stepwise distillation technique keeping the temperature constant at 140° C. for 1 hour, 190° C. for 2 hours and 215° C. for 1 hour and then the vacuum was applied. When the flask temperature was 235° C. and vacuum pressure was 20 mm, the molten resin was discharged to an alumimum tray. The void viscosity and dissolution rate in inorganic and organic solvent were determined and are shown in Table 1 below.

EXAMPLE 9 TO 14

The procedure of example 8 was repeated using different amounts of 3-picoline (added before condensation) and oxalic acid to make the novolak resins of example 9 to 14, shown in Table 1 below.

TABLE 1

Effect of 3-Picoline and Oxalic Acid on Viscosity and GPC Molecular Weight of Novolak Resin (3-Picoline was Added Before Condensation).

| Example # | Oxalic (%) | 3-Picoline (%) | V.V | MW/MW(BD)* # |
|---|---|---|---|---|
| 8 | 1.5 | 0.02 | 12.7 | 6751/13107 |
| 9 | 0.5 | 0.08 | 15.2 | 7654/5880 |
| 10 | 1.0 | 0.05 | 17.7 | 11185/9607 |
| 11 | 0.5 | 0.02 | 15.0 | 9207/5938 |
| 12 | 1.5 | 0.08 | 20.1 | 15153/13701 |
| 13 | 1.0 | 0.05 | 17.3 | 11196/9839 |
| 14 | 1.0 | 0.07 | 18.4 | 11939/8961 |

TABLE 1-continued

Effect of 3-Picoline and Oxalic Acid on Viscosity and GPC Molecular Weight of Novolak Resin (3-Picoline was Added Before Condensation).

| Example # | Oxalic (%) | 3-Picoline (%) | V.V | MW/MW(BD)* # |
|---|---|---|---|---|

Note: V.V = void viscosity; MW — molecular weight of the final resin by GPC; MW(BD) = molecular weight of resin sample obtained before distillation.

EXAMPLES 15 TO 23

The procedure of example 8 was repeated using different amounts of 3-picoline (added after condensation) and oxalic acid to make the novolak resins of examples 15 to 23, shown in Table 2 below.

TABLE 2

The Effect of Various Amount of 3-Picoline on Viscosity, GPC Molecular Weight (3-Picoline is Added After Condensation):

| Example # | Oxalic (%) | 3-Picoline (%) | V.V | MW/MW(BD) |
|---|---|---|---|---|
| 15 | 1.5 | 0.02 | 18.8 | 15042/11443 |
| 16 | 0.5 | 0.08 | 17.1 | 8794/8121 |
| 17 | 1.0 | 0.05 | 18.7 | 15675/15770 |
| 18 | 0.5 | 0.02 | 16.4 | 8374/7255 |
| 19 | 1.5 | 0.08 | 20.1 | 17200/17121 |
| 20 | 1.0 | 0.05 | 18.9 | 16790/15751 |
| 21 | 1.0 | 0.07 | 20.9 | 15733/15528 |
| 22 | 1.0 | 0.05 | 20.6 | 14695/13706 |

EXAMPLES 23 AND 24

The procedure of example 8 was repeated adding piperidine and pyridine (before condensation), respectively, instead of 3-picoline, to make the novolak resins of examples 23 to 26, as shown in Table 3 below.

TABLE 3

| | Other Lewis Bases Added Before Condensation | | | |
|---|---|---|---|---|
| Example # | Base | Amount | V.V | MW/MW(BD) |
| 23 | Piperidine | 0.05% | 16.1 | 9932/9838 |
| 24 | Pyridine | 0.05% | 20.0 | 14133/13651 |

Comparative Examples 25 and 26

The procedure of example 8 was repeated to make novolak resins identical to the resins of examples 17 and 19. No Lewis base was added, to show that the resins obtained are depolymerized, as shown in Table 4 below.

TABLE 4

Partial Depolymerization of Novolak Resin in Absence of Lewis Base

| Example | Cresols | V.V | MW | (MW(BD) |
|---|---|---|---|---|
| 25 | Example 1 | 8.4 | 8310 | 20835 |
| 26 | Example 3 | 7.3 | 3616 | 42025 |

EXAMPLES 27 TO 32

Into a 2000 gal. stainless steel lined reaction kettle, having a pressure rating of 300 psig and a 3 inch 115 psig rupture disk were added: 61.3 lbs. of unpurified oxalic acid as a powder and 5 gal. of DI water, through a port with a ball valve. 6131 lbs. of a mixture of 46.2 percent m-cresol, 40.5 percent p-cresol, 5.6 percent 2, 5-xylenol and 6.8 percent of 2, 4-xylenol (having a very low metals content and less than 10 ppm Lewis base) were added.

The reaction kettle agitator was set at about 100 rpm and the temperature was maintained at 92°–96° C. Over a 3 hours period, 3211 lbs. of the formaldehyde solution of Example 5 was added at a mass flow rate of about 18 lbs/min. The temperature was then maintained at 92°–96° C. for 8 hours. 3 lbs. of 3-Picoline was added and atmospheric distillation of the solvent was initiated. The temperature of the reaction mixture was raised over a period of 6 hours to about 215° C. Samples at 120° C. and 190° C. were collected to compare the molecular weight of the resin, by GPC. Additional heat and vacuum were applied to the reaction kettle until the temperature reached about 235° C. and 20 mm Hg vacuum, which was held for about 30 minutes. The vacuum was then released and the reaction was complete. A sample was collected and 7208 lbs. of PGMEA was added into the reaction kettle, over a period of about 35 minutes. The product was dissolved in the PGMEA and the resulting solution of novolak resin was passed through a 0.4 micron Cuno cartridge filter. The resulting solution of 40 percent novolak in PGMEA contained 64 ppb sodium ions, 28 ppb potassium ions, 47 ppb iron ions, 43 ppb chromium ions, 47 ppb calcium ions and 30 ppb aluminum ions.

Table 5 below shows the properties of the resins obtained.

TABLE 5

Examples 27–32 Resins

| Example # | Formaldehyde | 3-Picoline % | Void Viscosity |
|---|---|---|---|
| 27 | 0.730 | 0.05 | 23.0 |
| 28 | 0.730 | 0.03 | 18.2 |
| 29 | 0.730 | 0.03 | 17.9 |
| 30 | 0.740 | 0.03 | 21.5 |
| 31 | 0.725 | 0.03 | 17.5 |
| 32 | 0.725 | 0.03 | 17.5 |

Comparative Example 33 and 34

The procedure of Example 19 was repeated using the same pure cresols and formaldehyde but no 3-picoline was added. The product was dissolved in about 7500 lbs. of PGMEA. Table 6 shows the properties of the product.

TABLE 6

Resin Obtained in the Absence of Lewis Base

| Example | Cresols | V.V | MW/MW(BD) |
|---|---|---|---|
| 33 | Substantially Lewis Base Free/Metal Ion Free | 14.6 | 1011/20420 |
| 34 | Substantially Lewis Base Free/Metal Ion Free | 13.1 | 8430/16664 |

EXAMPLE 35

A Photoresist solution was prepared as follows: Into 73.88 grams of PGMEA, 19.58 grams of the novolak resin from Example 13 was added. A mixture of photosensitizers was added as follows: 3.26 grams of 2,1,5-diazonaphthoquinone sulphonie acid ester (40% to 80% estefification) of 2,3,4,4'-tetrahydroxybenzophenone, 2.61 grams of the 2,1,5- diazonaphthoquinone sulphonic acid ester (40% to 80% estefification) of 2,3,4-trihydroxybenzophenone and 0.651 grams of the 2,1,5-diazonaphthoquinone sulphonic acid ester (82% to 91% estefification) of 2,3,4-trihydroxybenzophenone. The photosensitizers and 0.020 grams of FC-430 surfactant (fluoroaliphatic polymeric ester available from 3M Corp.) were dissolved and filtered through a membrane filter (0.2 um in pore size). The photoresist solutions were spin coated, using standard techniques, onto quartz plates at a constant speed to obtain a layer of photoresist having an initial thickness of 1.5 um. The plates were baked in a circulating air oven at 90° C. for 30 minutes.

This photoresist was compared with a control photoresist (AZ 6212, available from the Electronic Products Division of Hoechst Celanese Corp.) for photospeed, contrast, dark film loss, thermal stability and aging. The photospeed was 2.6% faster; contrast—no difference; dark film loss was 4% faster, thermal stability—no difference; aging (5 days at 50° C.)—no difference.

We claim:

1. A method for producing a positive photoresist composition comprising:

a) washing an acidic ion exchange resin with water, washing said ion exchange resin with a mineral acid solution and thereby reducing the metal ions in the ion exchange resin to less than 500 ppb each;

b) passing a water/formaldehyde solution through the ion exchange resin and thereby reducing the metal ion level of the solution to less than 500 ppb each;

c) providing one or more phenolic compounds having a metal ion content of less than 200 ppb each;

d) providing such admixture with a Lewis base concentration before condensation, of from about 10 to 1000 ppm, condensing the formaldehyde with said one or more phenolic compounds, in the presence of an acid catalyst, and thereby producing a water insoluble, aqueous alkali soluble novolak resin having a desirable and consistent molecular weight, a metal ion level of less than 500 ppb each;

e) providing an admixture of: 1) a photosensitive component in an amount sufficient to photosensitize the photoresist composition, 2) the water insoluble, aqueous alkali soluble novolak resin and 3) a solvent.

2. The method of claim 1 wherein the Lewis base concentration is adjusted after condensation.

3. The method of claim 1 wherein the Lewis base is a hydroxide of an organic counterion.

4. The method of claim 3 wherein the Lewis base is an ammonium hydroxide.

5. The method of claim 1 wherein the Lewis base is an organic base added to the reaction mixture either: 1) neat as a solid or liquid, or 2) as a salt or a solution in water or a suitable organic solvent or a mixture of an organic solvent and water and wherein the Lewis base is an organic compound having one of the following formulas:

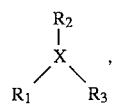

Formula 2

-continued

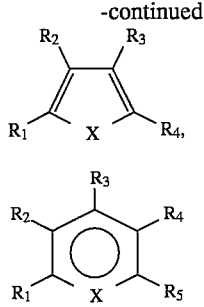

Formula 3

Formula 4 where $X=N$ or $CR_6$, provided that there is at least one basic center in the molecule if $X=CR_6$ and where in Formula 2, X can be P; where $R_1$ to $R_6$ may be any of the following:

1) hydrogen, $C_1$–$C_{10}$ alkyl;
2) $C_3$–$C_{10}$ cycloaklyl;
3) hydroxy;
4) $C_1$–$C_{10}$ alkyloxy, $C_3$–$C_{10}$ cyclolkyloxy and $C_6$–$C_{12}$ aryloxy;
5) $C_1$–$C_{10}$ alkyl or $C_6$–$C_{12}$ aryl carboxylic acid or ester —COOR and keto-subsitutent —C(=O)R, where R is H, $C_1$–$C_{10}$ alkyl or $C_6$–$C_{12}$ aryl;
6) halogen or nitro;
7) amine, $C_1$–$C_{10}$ alkyl- or dialkylamino;
8) $C_3$–$C_{10}$ cycloaklylamino and dicyeloalkylamino; and
9) $C_3$–$C_{10}$ cycloalkyl where at least two of the substitutents $R_1$ to $R_7$ are pan of a cyclic or polycyclic ring system.

6. The method of claim 1 where in the Lewis base is a tetra substituted ammonium hydroxide of an organic counted on having the formula:

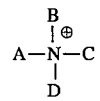

Formula 1 where the substitutents A, B, C and D may be:

1) $C_1$–$C_{10}$ alkyl;
2) $C_3$–$C_{10}$ cycloalkyl;
3) $C_6$–$C_{12}$ aryl or alkylaryl $C_1$–$C_{10}$ alkyl, $C_6$–$C_{12}$ aryl) substituents;
4) $C_1$–$C_{10}$ alkyloxy or $C_3$–$C_{10}$ cycloalkyloxy;
5) $C_6$–$C_{12}$ aryloxy;
6) $C_1$–$C_{10}$ alkyl or $C_6$–$C_{12}$ aryl carboxylic acid or ester —COOR and keto-substituents —C(=O)R, where R is H. $C_1$–$C_{10}$ alkyl or $C_6$–$C_{12}$ aryl;
7) amino, $C_1$–$C_5$ alkyl- and dialkylamino;
8) $C_3$–$C_{10}$ cycloaldylamino and dicycloaklylamino;
9) $C_3$–$C_{10}$ cycloalkyl where at least two of the substitutents A to D are part of a $C_3$–$C_{10}$ to cyclic or polycyclic ting system.

7. The method of claim 1 or 2 wherein the solvent is selected from the group consisting of propylene glycol methyl ether acetate, ethyl lactate and ethyl-3-ethoxypropionate.

\* \* \* \* \*